United States Patent [19]

Youngfleish

[11] Patent Number: 5,373,626
[45] Date of Patent: Dec. 20, 1994

[54] REMOVABLE PIN CARRIER
[75] Inventor: Frank C. Youngfleish, Penna Furnace, Pa.
[73] Assignee: Elco Corporation, Huntingdon, Pa.
[21] Appl. No.: 1,060
[22] Filed: Jan. 6, 1993
[51] Int. Cl.⁵ .............................................. H05K 3/30
[52] U.S. Cl. ...................................... 29/739; 29/758
[58] Field of Search .................. 439/885; 29/739, 747, 29/758, 838, 843, 845, 760; 206/328, 329, 330

[56] References Cited
U.S. PATENT DOCUMENTS

| | | | |
|---|---|---|---|
| 3,807,045 | 4/1974 | Bennett et al. | 29/629 |
| 4,188,715 | 2/1980 | Ammon et al. | 439/82 |
| 4,442,938 | 4/1984 | Murphy | 206/329 |
| 4,475,284 | 10/1984 | Johnson | 29/739 |
| 4,615,927 | 10/1986 | Holzmann | 428/35 |
| 4,787,510 | 11/1988 | Powell | 206/329 |
| 4,904,212 | 2/1990 | Durbin | 29/845 |
| 5,169,347 | 12/1992 | Sang | 29/739 |

OTHER PUBLICATIONS

Bunnell, P. Singh, IBM Technical Disclosure Bulletin, vol. 26, No. 6, Nov. 1983, pp. 2709–2710.

Primary Examiner—Neil Abrams
Attorney, Agent, or Firm—Spensley, Horn, Jubas & Lubitz

[57] ABSTRACT

A pin carrier for locating male contact pins on a printed circuit board (PCB) with a very high degree of accuracy, while placing a very low thermal mass in contact with each male contact pin. The pin carrier has a plurality of chimney structures, each chimney structure configured to retain one male contact pin. Male contact pins are inserted into each chimney such that essentially only that portion of the male contact pin which is to enter the PCB is exposed. The male contact pins are held in the chimney by a frictional retention force just sufficient to maintain the male contact pins securely within the chimneys during shipment and soldering onto a PCB, but not so great as to make removal of the pin carrier difficult after the male contact pins have been soldered to a PCB. In addition to registering the pins while maintaining a low thermal mass, the chimney structure also protects the male contact pin from excessive solder flow due to solder wicking, and from the corrosive effects of solder flux.

13 Claims, 2 Drawing Sheets

REMOVABLE PIN CARRIER

BACKGROUND OF THE INVENTION

1. Field of the Invention

This invention relates to electrical interconnection devices, and more particularly to a removable pin carrier for positioning male electrical contacts on a printed circuit board.

2. Description of Related Art

Numerous means are known today for interconnecting electrical and electronic components. One common means for interconnecting electronic components involves installing male contact pins made of an electrically conductive material on a substrate, such as a printed circuit board (PCB), upon which the electronic components are mounted. At least one of the male contact pins is electrically coupled to one or more of the electronic components of the PCB. Similarly, female contact receptacles and electronic components are mounted on a substrate, such as a second PCB. At least one of the female contacts is electrically coupled to one or more of the electronic components of the second PCB. The male contact pins of the first PCB are aligned with the female contact receptacles of the second PCB, and each male contact pin mates with a corresponding one of the female contact receptacles. Thus, those components of the first PCB which are coupled to male contact pins can be electrically coupled to those components of the second PCB which are coupled to female contact receptacles.

Typically, a plurality of male contact pins are bound together by an insulating housing which aligns the pins with respect to one another and to the printed circuit board on which they are to be soldered. Likewise, the female contact receptacles are typically bound together within a housing. The housing provides very good registration between the male contact pins and mounting holes of a PCB, and between the male contact pins and corresponding female contact receptacles. However, the housing takes up valuable space, or "real estate", on PCBs and projects above the surface of a PCB. Therefore, many attempts have been made to devise a removable pin carrier that would allow the male contact pins to be registered to the PCB and the female contact receptacles, but which could be removed later, leaving only the male contact pins connected to the PCB.

FIGS. 1a–1d illustrate one example of a prior art system in which a pin carrier 2 holds male contact pins 1 in registration prior to installation, and which is removed after the male contact pins 1 have been soldered to a PCB 3. See IBM Technical Disclosure Bulletin, Bunnell, K. J., Singh, P., Thakkar, A. J., and Tomassini, E. V. (Vol. 26, No. 6, November 1983). Two embodiments of the removable pin carrier are described in this reference. In the first, illustrated in FIG. 1a–1c, the pins 1 are installed into a pin carrier 2 such that only the portion of the pin 1 that enters a PCB 3 and a very small portion of the pin 1 that remains above the PCB 3 are exposed. The male pins 1 are supported in a PCB 3 by the pin carrier 2 with sufficient friction to retain the pins 1 in the pin carrier during processing. The pins 1 extend below the carrier 2 a distance necessary to be fixed to the PCB 3 and extend above the PCB 3 a distance necessary to allow the pins 1 to mate with corresponding female contact receptacles. The pins 1 are soldered onto the PCB 3. Upon completion of the soldering operation, the pin carrier 2 is removed, leaving only the male pins 1 connected to the printed circuit board 3. In the second embodiment, illustrated in FIG. 1d, the pins 1 are installed in the pin carrier 4 such that the pins 1 protrude through the pin carrier 4 a significant amount.

The first embodiment can register the male contact pins 1 to a very high accuracy, thereby ensuring very close tolerance in locating the pins 1. However, the large thermal mass of the pin carrier 2 makes heating the male contact pins 1 during a soldering operation more difficult (i.e., heating the male contact pins 1 requires more thermal energy). As the number of male contact pins 1 being installed increases, it is more desirable to use less thermal energy to heat each male contact pin 1.

The second embodiment has a much lower thermal mass. However, greater protrusion of the male contact pins 1 from the pin carrier 4 makes registration of the male contact pins 1 less precise. Precision registration is critical when very large numbers of male and female contacts are to be mated to one another at once, and particularly when the dimensions of the contacts are very small, as is the case in many of today's applications.

Therefore, there is a need for a removable pin carrier that permits male contact pins to be located upon a PCB with a very high accuracy with respect to the PCB and the position of each other male contact pin. There is also a need for a removable pin carrier which has a very low thermal mass, thereby allowing the male contact pins to be heated to the temperature required to flow solder with a minimal expenditure of thermal energy.

The present invention is a pin carrier that provides very accurate registration of the male contact pins, while minimizing the thermal mass in contact with each male contact pin.

SUMMARY OF THE INVENTION

The present invention is a pin carrier for locating male contact pins on a printed circuit board (PCB) with a very high degree of accuracy, while placing a very low thermal mass in contact with each male contact pin. The pin carrier is preferably fabricated from a high temperature insulating material and has a plurality of chimney structures, each chimney structure configured to retain one male contact pin. Each chimney structure is connected at its proximal end to a rigid base. Male contact pins are inserted into each chimney such that essentially only that portion of the male contact pin which is to enter the PCB is exposed. The male contact pins are held in the chimney by a frictional retention force just sufficient to maintain the male contact pins securely within the chimneys during shipment and soldering onto a PCB, but not so great as to make removal of the pin carrier difficult after the male contact pins have been soldered to a PCB. By controlling the inside diameter of the chimney, the chimney wall thickness, and the resiliency of the material used to fabricate the chimney structure, the retention force may be very tightly controlled.

The use of the chimney structure allows the male contact pins to be very precisely located with respect to a PCB and with respect to each other while requiring very little additional thermal energy to heat the male contact pins to the temperature at which solder flows. The chimney structure also protects the male contact pin from excessive solder flow due to solder wicking, and from the corrosive effects of solder flux.

The details of the preferred embodiment of the present invention are set forth in the accompanying drawings and the description below. Once the details of the invention are known, numerous additional innovations and changes will become obvious to one skilled in the art.

DETAILED DESCRIPTION OF THE INVENTION

Throughout this description, the preferred embodiment and examples shown should be considered as exemplars, rather than as limitations on the present invention.

Figure 2:
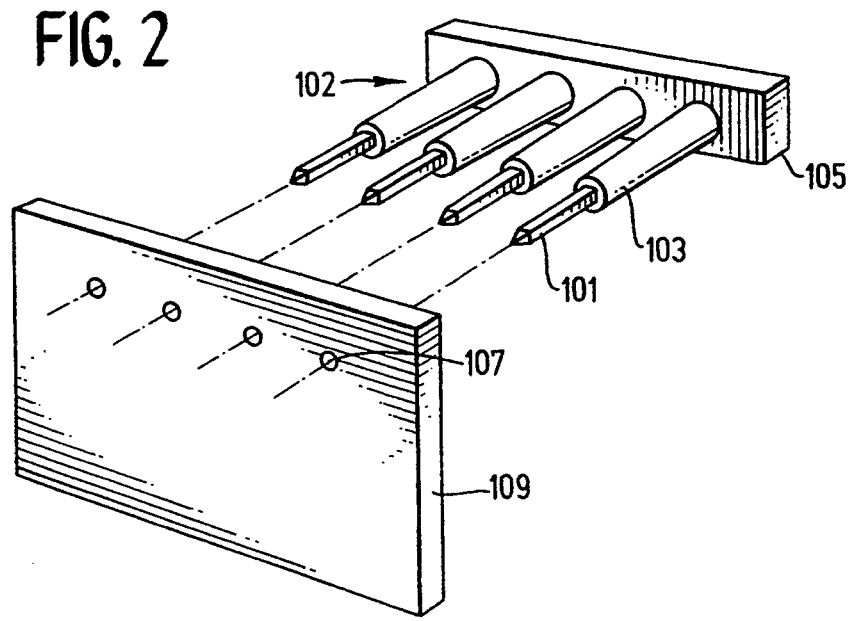
FIG. 2 is a perspective view of the inventive pin carrier aligned with a printed circuit board.

FIG. 2 is a perspective view of the preferred embodiment of the present invention. Four male contact pins 101 having a generally rectangular cross section are shown, each installed within a pin carrier 102. The pins 101 may be fabricated in known fashion from any generally rigid material that is conductive, such as metal, or which can be plated with a conductive plating.

The pin carrier 102 of the preferred embodiment is fabricated from a high temperature insulating material, such as nylon. The pin carrier 102 comprises a plurality of chimney structures 103 and a base 105. Each chimney 103 is generally shaped as a hollow cylinder, and is attached to the base 105 at a proximal end of the chimney 103. The inside diameter of each chimney 103 is configured to accept, by a friction fit, a male pin 101. The chimneys 103 are perpendicular to the base 105, co-parallel to each other, and spaced apart a distance that matches the spacing of corresponding holes 107 in a substrate, such as a printed circuit board (PCB) 109.

The present invention may include any number of chimneys 103 attached to a base 105. FIG. 2 shows four chimneys 103 and four corresponding pins 101 for illustrative purposes. The chimneys 103 may be arranged in a number of ways. For example, there may be two or more parallel rows of chimneys 103. The rows of chimneys 103 may be laid out in a square grid, or may be interlaced such that one row is offset from an adjacent row by half the distance between two adjacent chimneys 103 within the same row.

Figure 3A:
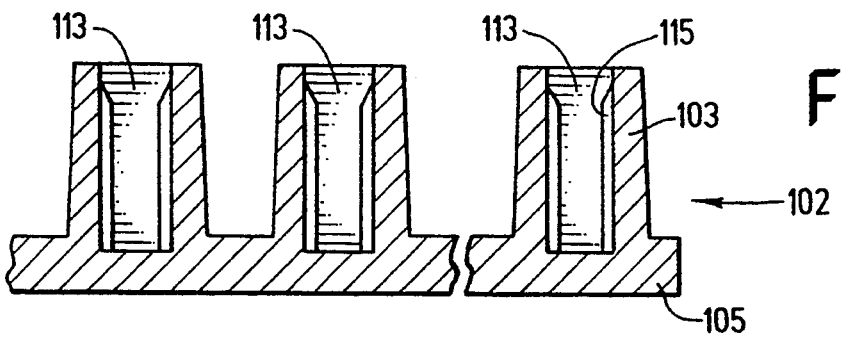
FIG. 3a is a side cross-sectional view of the inventive pin carrier without male contact pins.

FIG. 3a shows the pin carrier 102 without pins 101. The chimney 103 may be cylindrical, having a constant outer radius. However, in the preferred embodiment of the present invention, each of the chimneys 103 has a generally conical shape, the proximal end of each chimney 103 having a larger outer radius than the distal end thereof. Because the proximal end of each chimney 103 has a larger outer radius than at the distal end of the chimney 103, each chimney 103 has greater lateral stability than a cylindrical shape would provide. In an alternative embodiment of the present invention, the chimneys 103 have a generally rectangular cross-section, the cross-sectional area at the proximal end being greater than the cross-sectional area at the distal end of the chimney 103. It should be understood that the illustrated embodiments of the present invention are only examples, and that the cross-sectional shape of each chimney 103 may be any shape that would provide a stable support structure into which a male contact pin 101 may be removably inserted.

Figure 3B:
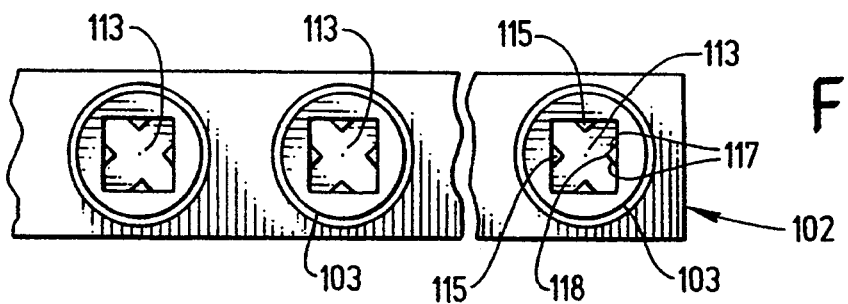
FIG. 3b is a top plain view of the inventive pin carrier.

FIG. 3b is a top plane view of the preferred embodiment of a pin carrier 102. Each chimney has an elongated central cavity 113 with a generally rectangular cross-section. An interior rib 115 is centrally located along each of the four walls of the interior cavity 113. Each interior rib 115 preferably has two generally flat orthogonal sides 117. The junction of the two sides 117 form an apex 118 that is coincident with a longitudinal axis of the central cavity 113. Accordingly, each rib 115 has a generally triangular cross-section. In an alternative embodiment, each rib 115 may have a generally semi-circular cross-section. The interior ribs 115 generate a retention force (i.e., the force required to remove a pin 101 from a chimney 103) against a pin 101 inserted within a chimney 103. By altering the dimensions of the rib 115, the retention force can be accurately controlled. In addition, the retention force can be controlled by careful control of the dimensions of the central cavity 113, the thickness and resiliency of the walls of the chimney 103, and the dimensions of the pins 101. The chimneys of the preferred embodiment of the present invention exert a retention force of approximately 2.8 oz on each of the pins 101, when pins 101 having a square cross-sectional area of approximately 0.016" and a length of approximately 0.1" are inserted.

In an alternative embodiment, no interior ribs 115 are provided within the central cavity 113. In still another alternative embodiment of the present invention, at least one interior wall of each chimney 103 has a plurality of ribs 115 projecting therefrom.

Figure 1A:
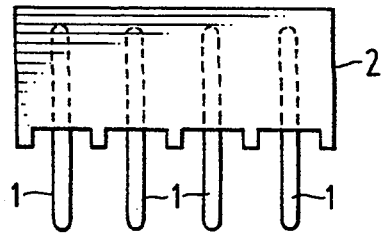
FIG. 1a is a side plane view of a prior art pin carrier.
Figure 1B:
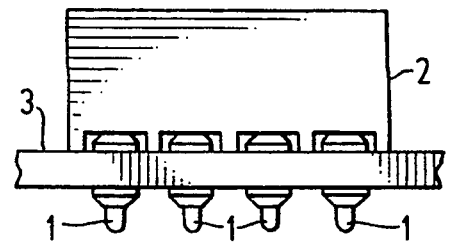
FIG. 1b is a side plane view of a prior art pin carrier mounted on a substrate.
Figure 1C:
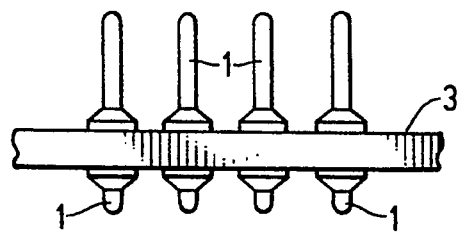
FIG. 1c is a side plane view of prior art pins mounted on a substrate after removal of a prior art pin carrier.
Figure 1D:
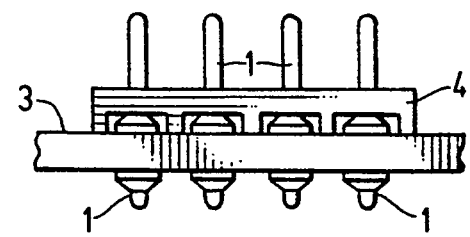
FIG. 1d is a side view of a prior art pin carrier.

Because each pin 101 is primarily supported by a chimney 103, the thermal mass of a pin 101 is substantially less than if the pin 101 were primarily supported by a solid structure of the type shown in FIG. 1a. In addition, in the preferred embodiment of the present invention, only the ribs 115 are in direct contact with the pin 101, thus reducing the thermal mass of each pin 101. Therefore, the amount of energy required to heat a pin 101 to the temperature at which solder flows is minimized. Furthermore, in the preferred embodiment of the present invention, each chimney 103 forms a seal around an inserted pin 101 at the distal end of the chimney 103. This seal helps prevent solder and solder flux from flowing up the pin 101, thereby protecting the pin 101 from solder wicking and the corrosive effects of solder flux.

Figure 4:
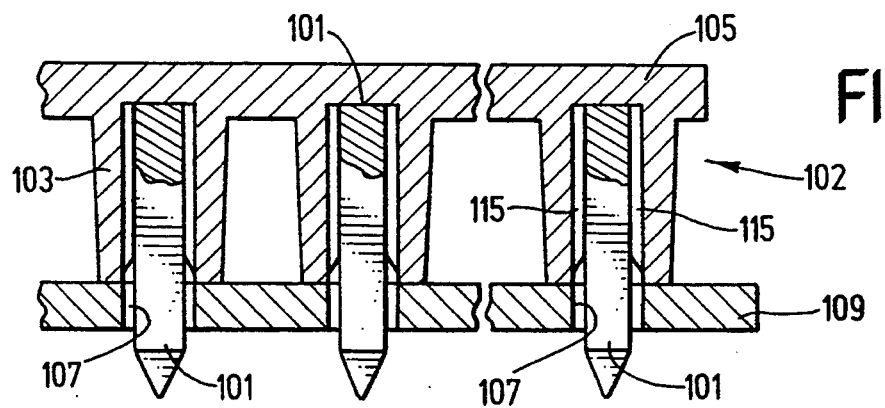
FIG. 4 is a side cross-sectional view of male contact pins installed in the inventive pin carrier and positioned on a printed circuit board prior to soldering.

Once pins 101 have been inserted into chimneys 103, and thus properly aligned, the pins 101 may be soldered into place and the pin carrier 102 removed from the pins 101. FIG. 4 is a side cross-sectional view of the pins 101 installed in the inventive pin carrier 102 and positioned on a PCB 109. The distal end of each chimney 103 rests upon the PCB 109 when each pin 101 is completely and properly inserted into a corresponding hole 107 in the PCB 109. Thus, the pins 101 are properly aligned perpendicular to the PCB 109 and parallel to each other pin 101. The assembly may now be soldered so as to attach the pins 101 to the PCB 109.

Figure 5:
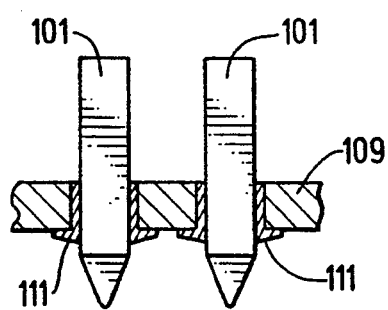
FIG. 5 is a side cross-sectional view of male contact pins installed in a printed circuit board after soldering and after the inventive pin carrier has been removed.
Figure 6:
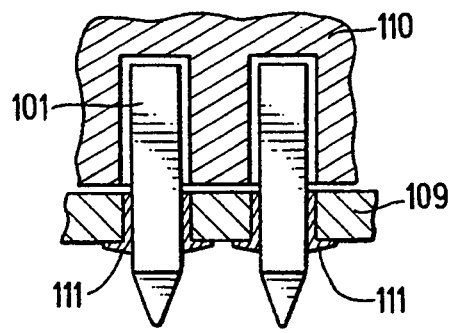
FIG. 6 is a side cross-sectional view of male contact pins installed in a printed circuit board after a mating component has been mated thereto. Like reference numbers and designations in the various drawings refer to like elements.

FIG. 5 shows the pins 101 soldered to the PCB 109 after the pin carrier 102 has been removed. Solder 111 electrically and physically joins the pins 101 to the PCB 109. Once the pin carrier 102 is removed, a mating component can mate with the pins 101. FIG. 6 illustrates a mating component 110 mated with pins 101 of the preferred embodiment of the present invention. Because no structure is left in place to align the pins 101, the mating component 110 can be located flush with the PCB 109. Thus, the distance between the PCB 109 and the mating component 110 is minimized, providing another advantage for using the present invention.

A number of embodiments of the present invention have been described. Nevertheless, it will be understood that various modifications may be made without departing from the spirit and scope of the invention. For example, the central cavity 113 may be cylindrical. Furthermore, the pins 101 may have a cross-section which takes any one of a number of shapes, such as rectangular, circular, oval, octagonal, etc. Also, the ends of the pins 101 may both be generally pointed, both generally flat, or one generally pointed and the other generally flat. Accordingly, it is to be understood that the invention is not to be limited by the specific illustrated embodiment, but only by the scope of the appended claims.

I claim:

1. A removable pin carrier for use in positioning pins to be affixed to a substrate and for non-destructive removal of the carrier from the pins once the pins are affixed into place to allow use of the pins, the removable pin carrier including:
    a) a rigid base means;
    b) a plurality of spaced apart chimney means, each having a distal end, a proximal end, and a single open cavity at the distal end, the proximal end being coupled to the rigid base means, for receiving a corresponding male contact pin within, and non-destructively removing the corresponding male contact pin from, the cavity thereof and retaining the pins in position while the pins are being affixed to the substrate.

2. The removable pin carrier of claim 1, wherein the rigid base means is fabricated from a high temperature nylon.

3. The removable pin carrier of claim 1, wherein each chimney means is fabricated from a high temperature nylon.

4. The removable pin carrier of claim 1, wherein each chimney means is generally conical, having a greater radius at the proximal end than at the distal end thereof.

5. The removable pin carrier of claim 1, wherein each chimney means is generally cylindrical.

6. The removable pin carrier of claim 1, wherein each chimney means has at least one rib means projecting from at least one wall of the cavity, for contacting a received male contact pin and generating a retention force against such contact pin.

7. The removable pin carrier of claim 6, wherein each rib means has a generally triangular cross-section.

8. The removable pin carrier of claim 6, wherein each rib means has a generally semi-circular cross-section.

9. The removable pin carrier of claim 1, wherein each chimney means has a generally rectangular cross-sectional area.

10. The removable pin carrier of claim 1, wherein each chimney means creates a seal around a received male contact pin, for blocking flow of solder or solder flux into the cavity.

11. An electrical carrier for use in positioning pins to be affixed to a substrate and for non-destructive removal of the carrier from the pins once the pins are affixed into place to allow use of the pins, and thus for interconnecting a substrate with at least one electrical subsystem, including:
    a) a rigid base means;
    b) a plurality of spaced apart chimney means, each having a distal end, a proximal end, and a cavity open at the distal end, the proximal end being coupled to the rigid base means;
    c) a plurality of male contact pins, each inserted into a corresponding one of the plurality of chimney means and non-destructibly removable therefrom, for conducting electrical current between the substrate and the at least one subsystem;
    wherein the carrier retains the pins in position while the pins are being affixed to the substrate.

12. An electrical carrier for use in positioning pins to be affixed to a substrate and for non-destructive removal of the carrier from the pins once the pins are affixed into place to allow use of the pins, and thus for electrically interconnecting a first electronic assembly having a substrate with a second electronic assembly having a plurality of female contact receptacles, including:
    a) a plurality of spaced apart chimney means, each chimney means corresponding with one of the plurality of male contact pin means, and each chimney means having a distal end, a proximal end, and a cavity which is open at a distal end, for receiving the corresponding male contact pin means within the cavity thereof, such pins being nondestructively removable, and for positioning each male contact pin means in three axes with respect to the substrate and each other male contact pin means;
    b) a rigid base means, coupled to the proximal end of each chimney means, for positioning each chimney means in three axes with respect to each of the other chimney means.

13. A method for use in positioning male contact pins to be affixed to a substrate and for non-destructive removal of a carrier from the pins once the pins are affixed into place to allow use of the pins, including the step of:
    a) inserting each male contact pin into a unique correspondence spaced apart chimney structure of the pin carrier;
    b) inserting the male contact pins into the holes in the substrate;
    c) affixing the male contact pins into the holes in the substrate;
    d) removing the male contact pins from the pin carrier.

* * * * *